United States Patent
Lin et al.

(10) Patent No.: US 8,527,915 B2
(45) Date of Patent: Sep. 3, 2013

(54) METHOD AND SYSTEM FOR MODIFYING DOPED REGION DESIGN LAYOUT DURING MASK PREPARATION TO TUNE DEVICE PERFORMANCE

(75) Inventors: Mei-Hsuan Lin, Tainan (TW);
Ling-Sung Wang, Tainan (TW);
Chih-Hsun Lin, Tainan (TW);
Chih-Kang Chao, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/286,410

(22) Filed: Nov. 1, 2011

(65) Prior Publication Data
US 2013/0111419 A1    May 2, 2013

(51) Int. Cl.
*G06F 17/50*    (2006.01)
(52) U.S. Cl.
USPC .................. 716/53; 716/50; 716/51; 716/54; 716/55

(58) Field of Classification Search
USPC ............... 716/50, 51, 52, 53, 54, 55; 257/70; 438/305, 595
See application file for complete search history.

(56) References Cited

U.S. PATENT DOCUMENTS

| | | | |
|---|---|---|---|
| 7,441,211 B1 | 10/2008 | Gupta et al. | |
| 2004/0003368 A1* | 1/2004 | Hsu et al. | 716/19 |
| 2006/0006389 A1* | 1/2006 | Buchholtz et al. | 257/70 |

* cited by examiner

*Primary Examiner* — Vuthe Siek
*Assistant Examiner* — Brian Ngo
(74) *Attorney, Agent, or Firm* — Haynes and Boone, LLP

(57) ABSTRACT

The present disclosure provides a method and system for modifying a doped region design layout during mask preparation to tune device performance. An exemplary method includes receiving an integrated circuit design layout designed to define an integrated circuit, wherein the integrated circuit design layout includes a doped feature layout; identifying an area of the integrated circuit for device performance modification, and modifying a portion of the doped feature layout that corresponds with the identified area of the integrated circuit during a mask preparation process, thereby providing a modified doped feature layout.

14 Claims, 5 Drawing Sheets

METHOD AND SYSTEM FOR MODIFYING DOPED REGION DESIGN LAYOUT DURING MASK PREPARATION TO TUNE DEVICE PERFORMANCE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
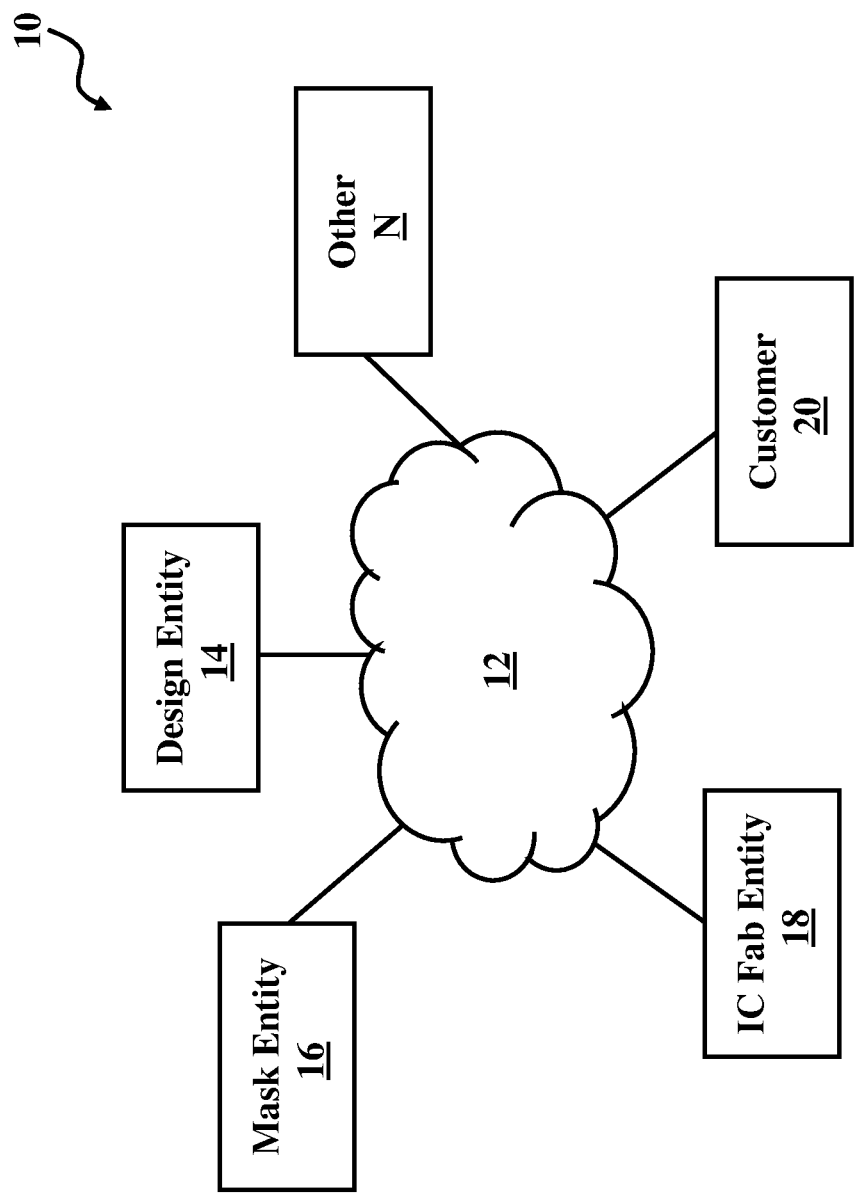
FIG. 1 is a block diagram of an integrated circuit manufacturing system according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of an integrated circuit manufacturing system 10 according to various aspects of the present disclosure. In the depicted embodiment, the integrated circuit manufacturing system 10 is a virtual integrated circuit fabrication system (a "virtual fab"). The integrated circuit fabrication system 10 fabricates integrated circuit devices. The integrated circuit manufacturing system 10 has been simplified for the sake of clarity to better understand the inventive concepts of the present disclosure. Additional features can be added in the integrated circuit fabrication system 10, and some of the features described below can be replaced or eliminated in other embodiments of the integrated circuit fabrication system 10.

The integrated circuit fabrication system 10 includes a network 12 that enables various entities (a design entity 14 (such as a design house), a mask entity 16 (such as a mask house), an integrated circuit fabrication entity 18, a customer 20, . . . other entity N) to communicate with one another. For example, each entity of the integrated circuit fabrication system 10 interacts with the other entities via the network 12 to provide services to and/or receive services from the other entities. The network 12 may be a single network or a variety of different networks, such as an intranet, an Internet, other suitable network, or combinations thereof. The network 12 includes wired communication channels, wireless communication channels, or combinations thereof.

For purposes of illustration, each entity may be referred to as an internal that forms a portion of the integrated circuit fabrication system 10 or may be referred to as an external entity that interacts with the integrated circuit fabrication system 10. The various entities may be concentrated at a single location or may be distributed, and some entities may be incorporated into other entities. In addition, each entity may be associated with system identification information that allows access to information within the system to be controlled based upon authority levels associated with each entities identification information. The integrated circuit fabrication system 10 enables interaction among the entities for the purpose of integrated circuit manufacturing, as well as the provision of services. In the present example, integrated circuit manufacturing includes receiving an integrated circuit customer order (for example, the customer entity 20 places an order for integrated circuits to the integrated circuit fabrication entity 18), the associated operations needed to produce the ordered integrated circuit (for example, the design entity 14 provides an integrated circuit design layout, based on specifications of the integrated circuit customer order, to the mask entity 16; the mask entity 16 fabricates a mask based on the integrated circuit design layout; and the integrated circuit fabrication entity 18 fabricates the integrated circuits using the mask).

Figure 2:
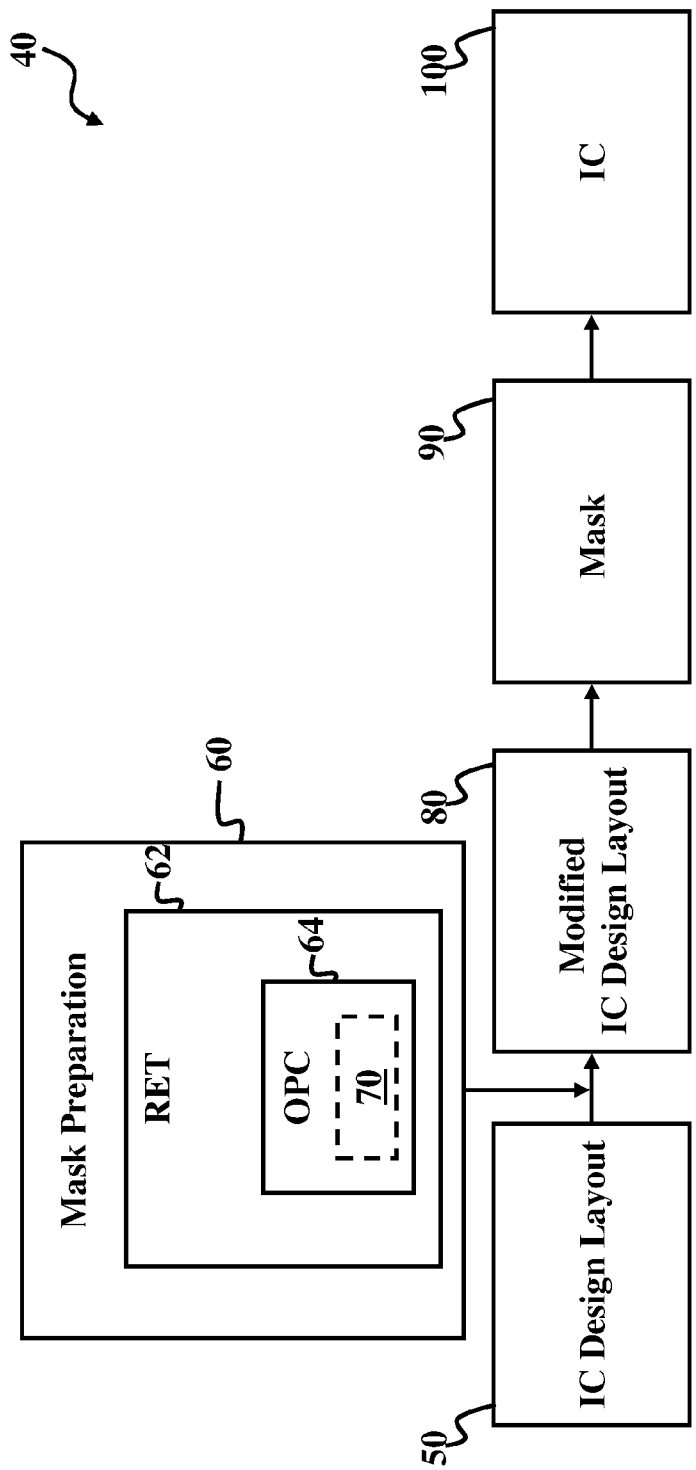
FIG. 2 is a flowchart of an integrated circuit design and fabrication flow that can be implemented by an integrated circuit manufacturing system, such as the integrated circuit manufacturing system of FIG. 1, according to various aspects of the present disclosure.

FIG. 2 is a block diagram of an integrated circuit design and fabrication flow 40 that can be implemented by an integrated circuit fabrication system according to various aspects of the present disclosure. For example, the integrated circuit design and fabrication flow 40 may be implemented by the integrated circuit fabrication system 10 of FIG. 1. Additional steps can be provided before, during, and after the integrated circuit design and fabrication flow 40, and some of the steps described can be replaced or eliminated for other embodiments of the integrated circuit design and fabrication flow 40.

In FIG. 2, at block 50, an integrated circuit design layout is provided. For example, a designer (such as a design house) provides an integrated circuit design layout of an integrated circuit to be manufactured to an integrated circuit manufacturer. The integrated circuit manufacturer can fabricate masks, wafers, or a combination thereof. In the present example, the design entity 14 provides the integrated circuit design layout to the mask entity 16 of an integrated circuit manufacturer. Alternatively, the integrated circuit manufacturer pulls the integrated circuit design layout from manufacturing data stored in a database of the integrated circuit manufacturer. The designer (such as the design entity 14), based on a specification of the integrated circuit to be manufactured, implements a design procedure to form the integrated circuit design layout. The design procedure may include logic design, physical design, place and route, other design mechanisms, or combinations thereof. The integrated circuit design layout includes various geometrical patterns designed for an integrated circuit, based on the specification of the integrated circuit. The integrated circuit design layout is presented in one or more data files expressed in a suitable format, such as in a GDS file format, a GDSII file format, a DFII file format, or other file format. The one or more data files have information of the various geometrical patterns. In an example, for illustration, the integrated circuit design layout includes various integrated circuit features (such as active regions, gate structures, source and drain features, and metal lines and contacts of an interlayer interconnection) to be formed on a wafer (such as a semiconductor substrate). The integrated circuit design layout may include design layouts associated with the various integrated circuit features. For example, the integrated circuit design layout includes a doped feature layout associated with doped regions of an integrated circuit, such as lightly doped source and drain regions of a transistor. In the present example, the doped feature layout defines critical dimensions of a resist layer used to form the doped regions of the integrated circuit.

At block 60, the integrated circuit design layout undergoes mask preparation. In the present example, the mask entity 16 performs mask preparation on the integrated circuit design layout. Mask preparation uses various resolution enhancement techniques (RET) (block 62) to modify the integrated circuit design layout to compensate for lithographic processes used to manufacture the integrated circuit. In the present example, various optical proximity correction (OPC) processes (block 64) may be applied to the integrated circuit design layout. During an optical proximity correction (OPC) process, the integrated circuit design layout is evaluated to determine whether OPC features (such as scattering bars, serifs, and/or hammerheads) should be added to the integrated circuit design layout. The OPC features (and/or bias) may be added or repositioned according to rule-based and/or model-based techniques such that a pattern formed by a lithography process during manufacturing of the integrated circuit is improved with enhanced resolution and precision.

Figure 3:
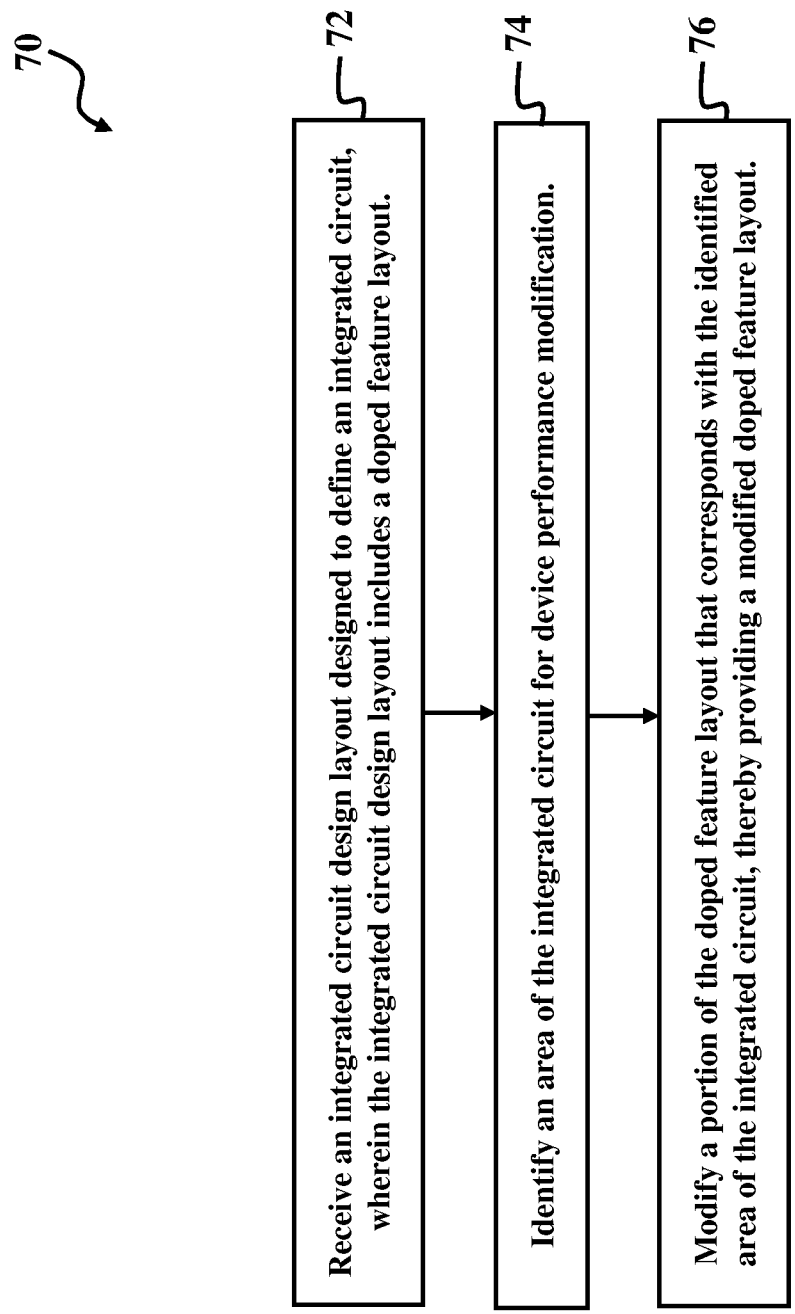
FIG. 3 is a flowchart of a method implemented in the integrated circuit design and fabrication method of FIG. 2 according to various aspects of the present disclosure.

In the present example, during the OPC process (block 64), a method 70 is implemented to modify the integrated circuit design layout to adjust performance characteristics of the integrated circuit. FIG. 3 is a flowchart of the method 70 according to various aspects of the present disclosure. At block 72, an integrated circuit design layout designed to define an integrated circuit is received. The integrated circuit design layout includes a doped feature layout. As noted above, in the present example, the integrated circuit design layout includes a doped feature layout associated with doped regions of the integrated circuit, such as lightly doped source and drain regions of a transistor, and the doped feature layout defines critical dimensions of a resist layer used to form the doped regions of the integrated circuit. The integrated circuit design layout may have undergone various mask preparation processes before applying the method 70. At block 74, an area of the integrated circuit is identified for device performance modification. In the present example, a transistor of the integrated circuit is identified where reducing leakage current is desired. Reducing the leakage current of the transistor can improve the transistor's performance and/or overall performance of the integrated circuit. At block 76, a portion of the doped feature layout that corresponds with the identified area of the integrated circuit is modified, thereby providing a modified doped feature layout. In the present example, where the transistor is identified for leakage current reduction, the portion of the doped feature layout defines a critical dimension of a resist layer that will be used to form doped regions, such as lightly doped source and drain regions, of the transistor. To modify the leakage current of the transistor, the critical dimension of the resist layer is modified. For example, the critical dimension is reduced such that, during manufacturing, a larger opening of a resist layer is formed that exposes the substrate and defines the doped region areas of the transistor, leading to an increased implant dosage and thus reduced leakage current of the transistor. Additional steps can be provided before, during, and after the method 70, and some of the steps described can be replaced or eliminated for other embodiments of the method 70.

Returning to FIG. 2, at block 60, the mask data preparation may implement other operations to prepare the integrated circuit design layout for mask making. The mask data preparation may implement a logic operation (or LOP) to the integrated circuit design layout. The logic operation modifies the integrated circuit design layout according to manufacturing rules. For example, various manufacturer modules convert manufacturing constraints into a set of rules that the integrated circuit design layout has to meet. If the integrated circuit design layout does not meet this set of rules, the integrated circuit design layout will be modified accordingly until the modified integrated circuit design layout meets these rules. In an example, the logic operation may be performed by the integrated circuit fab entity 18. The mask preparation may implement a pre-process and swap process. During the pre-process and swap process, the geometrical patterns in the integrated circuit design layout are divided, matched, and replaced for repetitive blocks of the integrated circuit design layout, such that the integrated circuit design layout is simplified for further processing. For example, in order to reduce process costs and time with enhanced efficiency, a repetitive pattern is replaced such that any further modification to the repetitive pattern will not be repeated for each repetitive pattern. If a repetitive pattern appears in various designs, it can be extracted into a database or library for future use. In this case, the repetitive pattern is replaced by a standard pattern in a library. The mask data preparation may implement an iteration and correction process to the integrated circuit design pattern. The process of adding the OPC features can be iterated and enhanced until the formed integrated circuit design layout can achieve high resolution or meet expected criteria based on the final pattern to be formed during integrated circuit manufacturing. Various features of the integrated circuit design layout, such as added OPC features, may be repositioned or resized for manufacturing benefits and/or product performance improvement, such as lithography resolution enhancement. Additionally or alternatively, other features may be added or other actions may be applied to the integrated circuit design layout during mask preparation. For example, dummy insertion features may be added to the integrated circuit design layout for enhanced chemical mechanical polishing (CMP) or other processing advantages. The mask preparation may implement a mask rule check (MRC) on the integrated circuit design layout, which involves further checking the integrated circuit design layout according to mask rules and modifying the integrated circuit design layout, if needed. For example, the mask rules in the MRC process are extracted from a mask fabrication module (such as the mask entity 16). Various mask making data are collected from the mask fabrication module and extracted into a set of rules that the integrated circuit design layout, as a pattern to be imaged to a mask, should follow. Additionally or alternatively, the mask rules or a subset of the mask rules are used as a guideline to tune the integrated circuit design layout. The MRC process may also or alternatively implement a design rule check (DRC) process.

At block 80, the mask preparation generates a modified integrated circuit design layout, and at block 90, a mask (also referred to as a photomask or reticle) or group of masks are fabricated based on the modified integrated circuit design layout. The mask entity 16 may fabricate the mask or group of masks based on the modified integrated circuit design layout. In the present example, a mask is fabricated based on the modified doped feature layout. The various geometrical patterns of the modified integrated circuit design layout may be transformed into a form that can be written, for example, by an electron beam (e-beam) writer, onto a mask. In an example, an e-beam or multiple e-beams are used to form a pattern on the mask (photomask or reticle) based on the modified integrated circuit design layout. The mask can be formed in various technologies. In an example, the mask is formed using binary technology. In an example, a mask pattern includes opaque regions and transparent regions. A radiation beam, such as an ultraviolet (UV) beam, used to expose the image sensitive material layer (such as a resist layer) coated on a wafer, is blocked by the opaque region and transmits through the transparent regions. In one example, a binary mask includes a transparent substrate (such as fused quartz) and an opaque material (such as chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be an attenuated PSM or an alternating PSM.

At block 100, the mask or group of masks are used to fabricate the integrated circuit defined by the integrated circuit design layout. The integrated circuit fabrication entity 18 may fabricate the integrated circuit using the mask or group of masks. For example, a semiconductor wafer (substrate) is processed using the mask (or group of masks) to form the integrated circuit. The mask or group of masks may be used in a variety of processes. For example, the mask may be used in an ion implantation process to form various doped regions in the semiconductor wafer, in an etching process to formed various etching regions in the semiconductor wafer, in a deposition process (such as chemical vapor deposition or physical vapor deposition) to form a thin film in various regions on the semiconductor wafer, other suitable processes, or combinations thereof. In the present example, during manufacturing, the mask fabricated based on the modified doped feature layout is used to form doped regions of the integrated circuit, specifically doped regions of transistors of the integrated circuit. The patterned resist layer has openings that expose the substrate, and an ion implantation process is performed on the exposed substrate to form doped regions of the transistors. In areas of the substrate that correspond with areas of the modified doped feature layout, where critical dimensions were reduced, the openings of the patterned resist layer are larger than they would have been if the original doped feature layout had been used to fabricate the mask. Accordingly, such areas of the substrate receive a greater implant dosage, which can lead to transistors associated with such areas having reduced leakage current.

Figure 4:
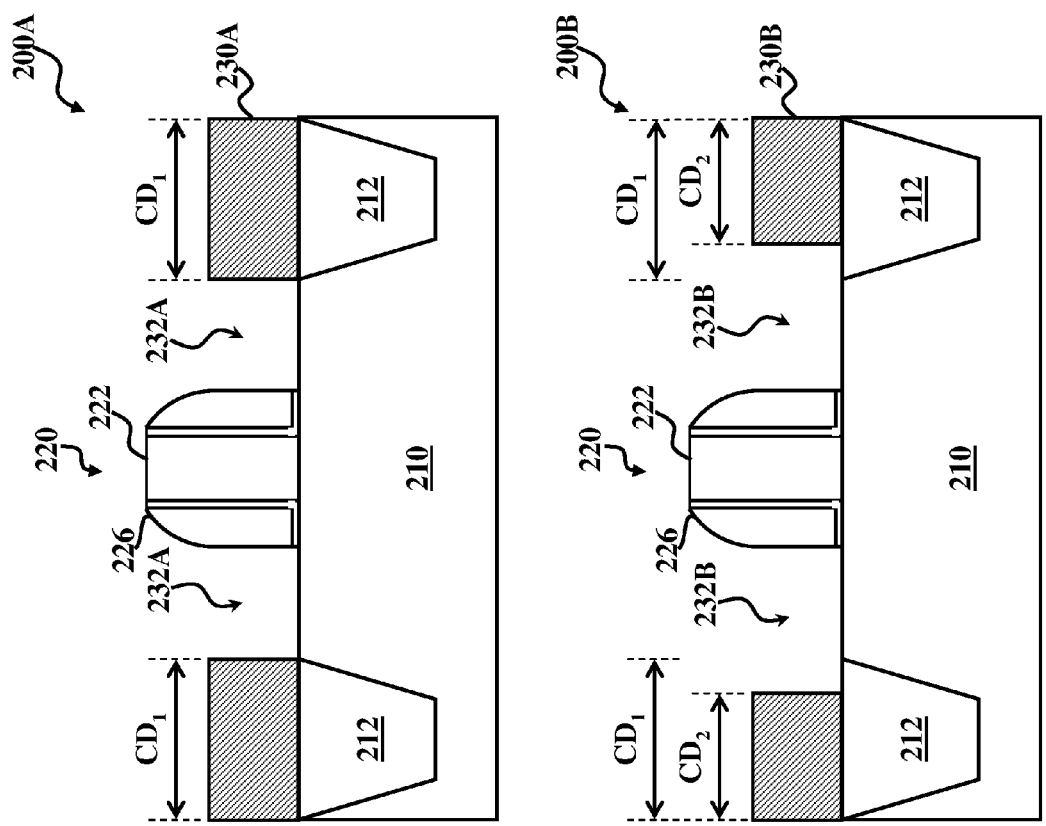
FIG. 4 and FIG. 5 are diagrammatic cross-sectional views of integrated circuit devices, in portion or entirety, that may be fabricated in the integrated circuit design and fabrication method at various stages of fabrication according to various aspects of the present disclosure.
Figure 5:
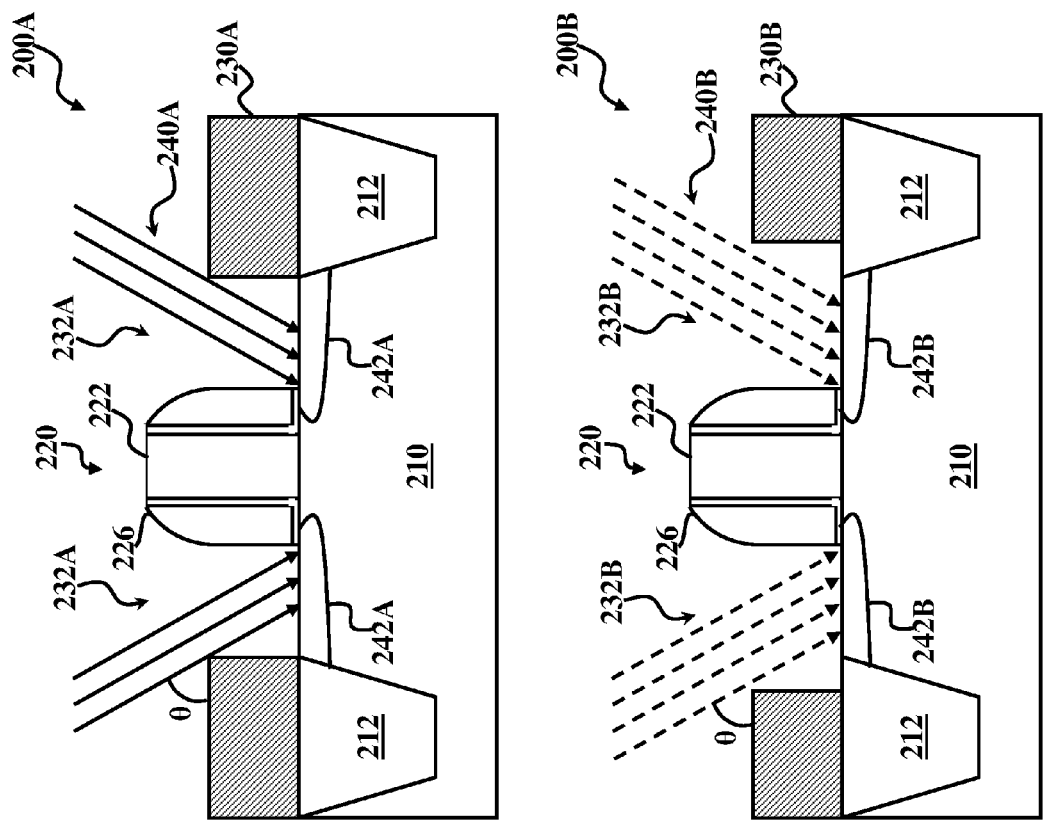

FIG. 4 and FIG. 5 are diagrammatic cross-sectional views of an integrated circuit device 200A and an integrated circuit device 200B, at various stages of fabrication, that may be fabricated in the integrated circuit design and fabrication flow 40 of FIG. 2 according to various aspects of the present disclosure. FIG. 4 and FIG. 5 will be discussed concurrently and have been simplified for the sake of clarity to better understand the inventive concepts of the present disclosure. In FIGS. 4 and 5, the integrated circuit devices 200A and 200B are fabricated using masks fabricated based on an integrated circuit design layout. As described further below, in FIGS. 4 and 5, doped features of the integrated circuit device 200A are formed with a mask fabricated based on an integrated circuit design layout achieved without applying a device performance modification method during mask preparation, such as the method 70 described with reference to FIGS. 2 and 3; and doped features of the integrated circuit device 200B are fabricated with a mask fabricated based on an integrated circuit design layout achieved by applying device performance modification method during mask preparation, such as the method 70 described with reference to FIGS. 2 and 3.

The integrated circuit devices 200A and 200B include a transistor during fabrication. The integrated circuit devices 200A and 200B can include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), p-channel metal-oxide-semiconductor field effect transistors (PFETs), n-channel metal-oxide-semiconductor field effect transistor (NFETs), high voltage transistors, and/or high frequency transistors; other suitable components; or combinations thereof. Additional features can be added in the integrated circuit devices 200A and 200B, and some of the features described below can be replaced or eliminated for additional embodiments of the integrated circuit devices 200A and 200B.

The integrated circuit devices 200A and 200B include a substrate 210. In the depicted embodiment, the substrate 210 is a semiconductor substrate including silicon. The substrate may be a p-type or n-type substrate. Alternatively or additionally, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, the substrate 210 may include a doped epi layer, a gradient semiconductor layer, and/or a semiconductor layer overlying another semiconductor layer of a different type, such as a silicon layer on a silicon germanium layer. The substrate 210 may include various doped regions depending on design requirements of the integrated circuit devices 200A and 200B (for example, p-type wells or n-type wells). The doped regions may be doped with p-type dopants, such as boron or $BF_2$; n-type dopants, such as phosphorus or arsenic; or a combination thereof. The doped regions may be formed on the substrate 210, in a p-well structure, in an n-well structure, in a dual-well structure, or using a raised structure.

An isolation feature 212 is formed in the substrate 210 to isolate various regions of the substrate 210. For example, in the depicted embodiment, the isolation feature 212 defines active regions of the integrated circuit devices 200A and 200B, in which various integrated circuit devices are formed therein, such as the transistors of the integrated circuit devices 200A and 200B. The isolation feature 212 utilizes isolation technology, such as local oxidation of silicon (LOCOS) and/or shallow trench isolation (STI), to define and electrically isolate the various regions. The isolation feature 212 includes silicon oxide, silicon nitride, silicon oxynitride, other insulating material, or combinations thereof. In an example, forming an STI includes a photolithography process, etching a trench in the substrate (for example, by using a dry etching, wet etching, or combinations thereof), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

A gate structure 220 is disposed over the substrate 210. In the depicted embodiment, the gate structure includes a gate stack 222 and spacers 226. The gate structure 220 is formed by deposition processes, lithography patterning processes, etching processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other deposition methods, or combinations thereof. The lithography patterning processes include resist coating (such as spin-on coating), soft baking, mask aligning, exposure, post-exposure baking, developing the resist, rinsing, drying (such as hard baking), other lithography patterning processes, or combinations thereof. Alternatively, the lithography exposing process is implemented or replaced by other proper methods, such as maskless photolithography, electron-beam writing, or ion-beam writing. The etching processes include dry etching, wet etching, other etching methods, or combinations thereof.

The gate stack 222 includes a gate dielectric disposed over the substrate 210 and a gate electrode disposed over the gate dielectric. The gate dielectric includes a dielectric material, such as silicon oxide, silicon oxynitride, silicon nitride, a high-k dielectric material, other dielectric material, or combinations thereof. Exemplary high-k dielectric materials include $HfO_2$, HfSiO, HfSiON, HfTaO, HfTiO, HfZrO, $Ta_2O_5$, $TiO_2$, $Al_2O_3$, $ZrO_2$, $Y_2O_3$, $L_2O_3$, other high-k dielectric material, or combinations thereof. The gate dielectric may include a multilayer structure. For example, the gate dielectric may include an interfacial layer formed on the substrate, and a high-k dielectric material layer formed on the interfacial layer. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive material, or combinations thereof. The gate stack 222 may include numerous other layers (such as capping layers, interface layers, diffusion layers, barrier layers, hard mask layers, or combinations thereof) depending on design requirements of the integrated circuit devices 200A and 200B.

The spacers 226 are disposed along sidewalls of the gate stack 222 of the gate structure 220. The spacers 220 include a dielectric material, such as silicon oxide, silicon nitride, silicon oxynitride, other dielectric material, or combinations thereof. In an example, the spacers 226 are formed by blanket depositing a dielectric layer over the integrated circuit devices 200A and 200B, and then, anisotropically etching to remove the dielectric layer to form the spacers 226 as illustrated in FIGS. 4 and 5. In an example, the gate structure 220 further includes spacer liner, which may be disposed between the spacers 226 and the gate stack 222.

The various features of the integrated circuit devices 200A and 200B, such as the isolation feature 212 and gate structure 220 (including the gate stack 222 and the spacers 226) may be formed using masks based on an integrated circuit design layout, such as masks achieved by the integrated circuit design and fabrication flow 40 masks described above with reference to FIGS. 2 and 3. In FIGS. 4 and 5, doped regions of the integrated circuit device 200A are formed using a mask fabricated during the integrated circuit design and fabrication flow 40 where the method 70 was not applied, and doped regions of the integrated circuit device 200B are formed using a mask fabricated based on the integrated circuit design and fabrication flow 40 where the method 70 was applied.

In FIG. 4, a patterned resist layer 230A is disposed over the substrate 210 of the integrated circuit device 200A, and a patterned resist layer 230B is disposed over the substrate 210 of the integrated circuit device 200B. The patterned resist layer 230A has openings 232A therein that expose the substrate 210 of the integrated circuit device 200A, and the patterned resist layer 230A has a critical dimension, $CD_1$. The patterned resist layer 230B has openings 232B therein that expose the substrate 210 of the integrated circuit device 200B, and the patterned resist layer 230B has a critical dimension, $CD_2$. In the present example, the critical dimension, $CD_1$, of the patterned resist layer 230A is larger than the critical dimension, $CD_2$, of the patterned resist layer 230B. The variation in critical dimensions arises from the masks used to form the patterned resist layers 230A and 230B. More specifically, the patterned resist layer 230A was formed using a mask based on a modified doped feature layout where the method 70 was not used to adjust the doped feature layout; and the patterned resist layer 230B was formed using a mask based on the modified doped feature layout where the method 70 was applied to adjust the doped feature layout, resulting in a smaller critical dimension.

In FIG. 5, an ion implantation process 240A is performed on integrated circuit device 200A to form doped regions 242A, and an ion implantation process 240B is performed on the integrated circuit device 200B to form doped regions 242B. In the depicted embodiment, the doped regions 242A and 242B are lightly doped source and drain (LDD) regions, respectively, of the transistors of integrated circuit devices 200A and 200B. Further, in the depicted embodiment, the ion implantation processes 240A and 240B are tilt-angle ion implantation processes having substantially the same process parameters. Though the ion implantation process 240A uses substantially the same process parameters as the ion implantation process 240B, the transistor of integrated circuit device 200A performs differently than the transistor of integrated circuit device 200B. More specifically, a leakage current of the transistor of integrated circuit device 200B is less than a leakage current of the transistor of integrated circuit device 200A. Such device performance variation results in the variation in critical dimensions of the patterned resist layers 230A and 230B, which define areas of the substrate 210 for implantation. For example, the variation in critical dimensions results in the openings 232B of the patterned resist layer 230B being larger than the openings 232A of the patterned resist layer 230A, such that a larger implant dosage is achieved during ion implantation process 240B than during ion implantation process 240A.

Conventional integrated circuit device fabrication processes bias gate lengths, such as a length of the gate stack 222 of the gate structure 220, to achieve device performance variation (or optimization). For example, to achieve a reduced leakage current in the transistor of integrated circuit device 200B, the gate stack 222 would be fabricated such that its gate length is longer than the a gate length of the gate stack 222 of the integrated circuit device 220A. Such gate length biasing reduces a process window for forming contacts during subsequent integrated circuit fabrication. For example, where a gate length is increased to modify the device performance, a contact landing window is reduced, which may result in a contact landing on the gate structure, causing a short circuit (between the contact and gate structure) in the integrated circuit device. In contrast, in the present example, by modifying the device performance during the mask preparation stage, in particular, by modifying a critical dimension of a resist layer used to form the doped regions of the device, similar device performance modification (in other words, reduced leakage current) is achieved while enlarging the contact landing window. Such modification during the mask preparation stage may also be achieved while reducing manufacturing costs. Different embodiments may have different advantages, and that no particular advantage is necessarily required of any embodiment.

The integrated circuit devices 200A and 200B can continue with processing to complete fabrication as discussed briefly below. For example, heavily doped source/drain (HDD) regions are formed by ion implantation or diffusion of n-type dopants, such as phosphorous or arsenic, or p-type dopants, such as boron. Epitaxial source/drain features may be formed in the source and drain regions of the integrated circuit devices 200A and 200B. Additionally, silicide features are formed on the raised source/drain features, for example, to reduce contact resistance. The silicide features may be formed on the source and drain features by a process including depositing a metal layer, annealing the metal layer such that the metal layer is able to react with silicon to form silicide, and then removing the non-reacted metal layer. In an example, an inter-level dielectric (ILD) layer is formed on the substrate and a chemical mechanical polishing (CMP) process is further applied to the substrate to planarize the substrate. A contact etch stop layer (CESL) may be formed on top of the gate structure 220 before forming the ILD layer. Further, in an example, a multilayer interconnection (MLI) including metal layers and inter-metal dielectric (IMD) layers is formed over the substrate 210, such as over the ILD layer, to electrically connect various features or structures of the integrated circuit devices 200A and 200B. The multilayer interconnection includes vertical interconnects, such as vias or contacts, and horizontal interconnects, such as metal lines. The various interconnection features may implement various conductive materials including aluminum, copper, titanium, tungsten, alloys thereof, silicide materials, other suitable materials, or combinations thereof. In an example, a damascene process or dual damascene process is used to form a copper or aluminum multilayer interconnection structure.

The present disclosure can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The present disclosure provides for many different embodiment. An exemplary method includes receiving an integrated circuit design layout designed to define an integrated circuit, wherein the integrated circuit design layout includes a doped feature layout; identifying an area of the integrated circuit for device performance modification, and modifying a portion of the doped feature layout that corresponds with the identified area of the integrated circuit during a mask preparation process, thereby providing a modified doped feature layout. The method may further include fabricating a mask according to the modified doped feature layout. The method may further include forming a doped region in a substrate of the integrated circuit using the mask fabricated according to the modified doped feature layout. Forming the doped region in the substrate of the integrated circuit using the mask may include forming a patterned resist layer over the substrate using the mask.

Modifying the portion of the doped feature layout that corresponds with the identified area of the integrated circuit may be performed during an optical proximity correction (OPC) process of the mask preparation process. In an example, the area of the integrated circuit for device performance modification is identified during the mask data preparation process. In an example, identifying the area of the integrated circuit for device performance modification includes identifying a transistor for reducing a leakage current. In an example, the portion of the doped feature layout defines a critical dimension of a resist layer used to form a doped region of the integrated circuit, and modifying the portion of the doped feature layout includes modifying the critical dimension of the resist layer, such as reducing the critical dimension.

Another exemplary method includes receiving a doped feature design layout that defines a critical dimension of a resist layer used to form a doped region of an integrated circuit device; modifying the doped feature design layout during a mask preparation process to adjust performance of the integrated circuit device, wherein the modifying includes modifying the critical dimension; and fabricating a mask according to the modified doped feature design layout. Modifying the doped feature design layout may be performed during an optical proximity correction process of the mask preparation process. In an example, modifying the critical dimension includes reducing the critical dimension, which may reduce a leakage current of a transistor of the integrated circuit device. The method may further include forming a doped region in a substrate using the mask fabricated according to the modified doped feature design layout. The doped region may be a lightly doped source and drain region of a transistor. Forming the doped region may include forming a patterned resist layer over the substrate using the mask, wherein the patterned resist layer has an opening that exposes the substrate; and performing an ion implantation process on the exposed substrate. Modifying the critical dimension may include increasing an implant dosage of the ion implantation process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   receiving an integrated circuit design layout designed to define an integrated circuit, wherein the integrated circuit design layout includes a doped feature layout;
   identifying, by using a computer, an area of the integrated circuit that includes the doped feature layout for device performance modification, and
   modifying a portion of the doped feature layout that corresponds with the identified area of the integrated circuit during a mask preparation process, thereby providing a modified doped feature layout, wherein the portion of the doped feature layout defines a critical dimension of a resist layer used to form a doped region of the integrated circuit;
   wherein the modifying the portion of the doped feature layout that corresponds with the identified area of the integrated circuit is performed during an optical proximity correction process of the mask preparation process and modifying the portion of the doped feature layout includes modifying to reducing the critical dimension;
   wherein the identifying the area of the integrated circuit for device performance modification includes identifying a transistor for reducing a leakage current; and
   forming a doped region in a substrate of the integrated circuit using the mask fabricated according to the modified doped feature layout.

2. The method of claim 1 further including identifying the area of the integrated circuit for device performance modification during the mask preparation process.

3. The method of claim 1 wherein:
   the modifying the portion of the doped feature layout that corresponds with the identified area of the integrated circuit includes modifying the critical dimension of the resist layer.

4. The method of claim 3 wherein the modifying the critical dimension of the resist layer includes reducing the critical dimension.

5. The method of claim 1 further including fabricating a mask according to the modified doped feature layout.

6. The method of claim 5 further including forming a doped region in a substrate of the integrated circuit using the mask fabricated according to the modified doped feature layout.

7. The method of claim 6 wherein the forming the doped region in the substrate of the integrated circuit using the mask fabricated according to the modified doped feature layout includes forming a patterned resist layer over the substrate using the mask.

8. A method comprising:
   receiving a doped feature design layout that defines a critical dimension of a resist layer used to form a doped region of an integrated circuit device;
   modifying, by using a computer, the doped feature design layout during a mask preparation process to adjust performance of the integrated circuit device, wherein the modifying the portion of the doped feature layout that corresponds with the identified area of the integrated circuit is performed during an optical proximity correction process of the mask preparation process, and the modifying includes modifying to reduce the critical dimension;
   wherein the identifying the area of the integrated circuit for device performance modification includes identifying a transistor for reducing a leakage current; and
   fabricating a mask according to the modified doped feature design layout.

9. The method of claim 8 wherein the modifying the critical dimension includes reducing the critical dimension.

10. The method of claim 8 further including forming a doped region in a substrate using the mask fabricated according to the modified doped feature design layout.

11. The method of claim 10 wherein the forming the doped region includes forming a lightly doped source and drain region of a transistor.

12. The method of claim 10 wherein the forming the doped region in the substrate using the mask fabricated according to the modified doped feature layout includes:
    forming a patterned resist layer over the substrate using the mask, wherein the patterned resist layer has an opening that exposes the substrate; and
    performing an ion implantation process on the exposed substrate.

13. The method of claim 12 wherein the modifying the critical dimension includes increasing an implant dosage of the ion implantation process.

14. A system for manufacturing an integrated circuit device, the system comprising:
    a mask making entity operable to fabricate a mask, wherein the mask making entity includes a non-transitory computer readable medium that stores a plurality of instructions for execution by at least one computer processor, wherein the instructions are for:
    receiving a doped feature design layout that defines a critical dimension of a resist layer used to form a doped region of an integrated circuit device, modifying the doped feature design layout during a mask preparation process to adjust performance of the integrated circuit device, wherein the modifying the portion of the doped feature layout that corresponds with the identified area of the integrated circuit is performed during an optical proximity correction process of the mask preparation process and
    modifying the doped feature design layout to adjust performance of the integrated circuit device, wherein the modifying includes modifying to reduce the critical dimension
    wherein the identifying the area of the integrated circuit for device performance modification includes identifying a transistor for reducing a leakage current, and
    fabricating a mask according to the modified doped feature design layout.

* * * * *